Oct. 29, 1968 J. M. P. GATES 3,408,533
LOW-LOSS AMPLIFICATION CIRCUIT
Filed March 21, 1966
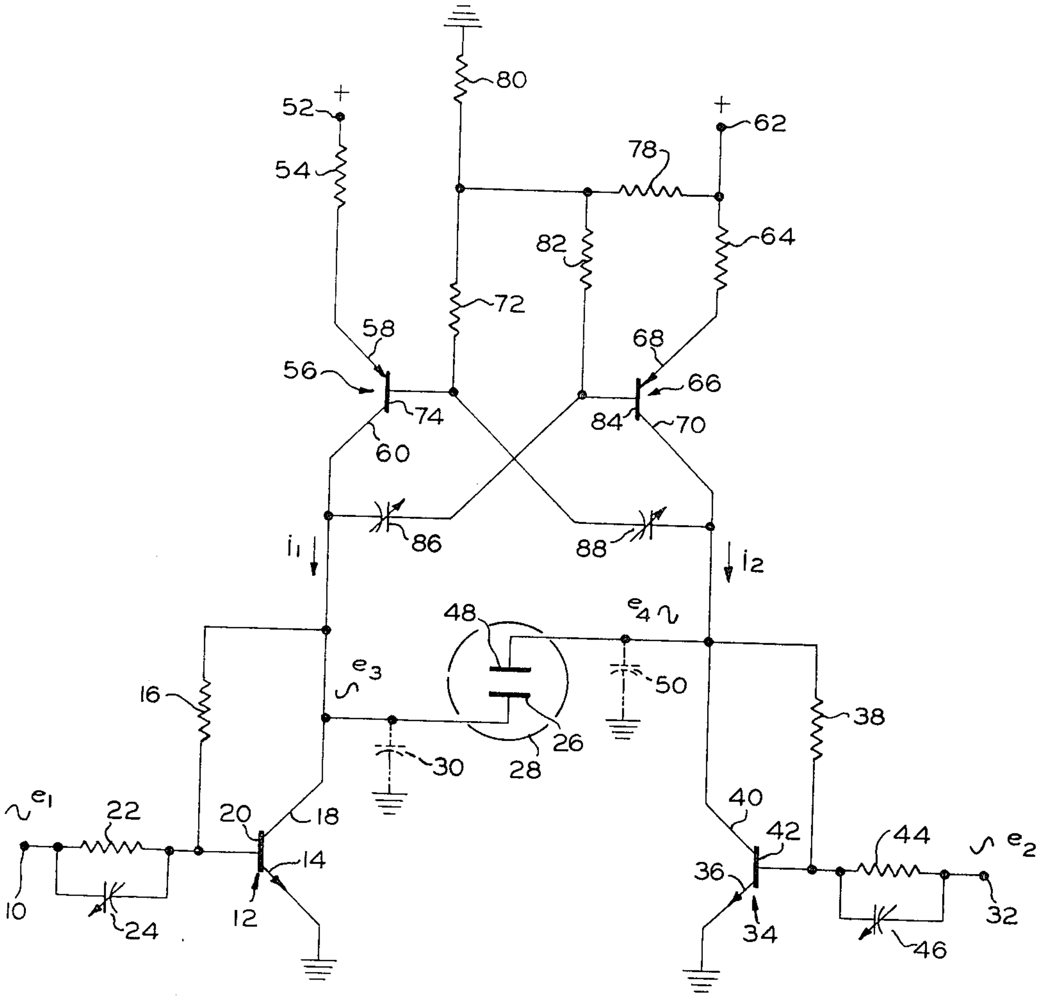
JOHN M.P. GATES
INVENTOR
BY
BUCKHORN, BLORE, KLARQUIST & SPARKMAN
ATTORNEYS United States Patent Office 3,408,533
Patented Oct. 29, 1968

3,408,533

LOW-LOSS AMPLIFICATION CIRCUIT

John M. P. Gates, Tokyo, Japan, assignor to Tekronix, Inc., Beaverton, Oreg., a corporation of Oregon Filed Mar. 21, 1966, Ser. No. 536,050
8 Claims. (Cl. 315—19)

ABSTRACT OF THE DISCLOSURE

A pair of first amplifier means drive opposite terminals of a load in push-pull fashion wherein the load is characterized by increased current demands as the frequency of operation increases. Additional amplifier means provide additional current to the first amplifier means for application to the load terminals with an increase in operating frequency. In the illustrated embodiment, frequency sensitive alternating current coupling means cross-couple each first amplifier means in driving relation to the additional amplifier means associated with the opposite load terminal, causing additional current to be delivered to the opposite amplifier means of the first pair.

This invention relates to a low-loss amplification circuit, and particularly to an amplification circuit normally operating at low currents while automatically providing for higher current operation as increased frequency and bandwidth input signals are received.

In the design of amplifiers, enough D.C. standing bias current is ordinarily supplied to provide for the highest bandwidth, maximum signal voltage output that will ever occur in the amplifier. This current must supply both the anode (or collector) load resistor voltage swing, and the displacement current necessary to charge the output capacity of the circuit plus the load and stray capacity. This D.C. standing current, multiplied by the D.C. voltage drop across the load and amplification device, is the D.C. power that is always dissipated as heat. This continuous power dissipation increases the expense of power supply construction and operation. Moreover, when a power supply comprises batteries as in the case of portable equipment, the battery life may be materially decreased.

Much of the time, such amplification apparatus does not actually require all of the power conventionally made available for the extreme case. If the input signal frequency is low, the displacement current necessary to charge the output capacitance of the amplification device plus load and stray capacity is also low. The excess current is really needed only for higher frequency input signal components.

It is therefore, an object of the present invention to provide an improved amplification circuit operating at lower power dissipation for low frequency, low bandwidth input signals, but which will automatically operate at higher power when higher bandwidth signals are received.

It is another object of the present invention to provide an improved amplification circuit for driving a push-pull load, e.g. the vertical deflection plates of the cathode ray tube, with a voltage signal which faithfully duplicates the input signal over a wide bandwidth range, without requiring excessive power dissipation in the amplification circuit.

It is a further object of the present invention to provide a low-loss amplification circuit which employs inexpensive components, or alternatively, higher bandwidth components not always available in higher power ratings, such circuit being capable of a wide range of operating frequencies.

Briefly, in accordance with an embodiment of the present invention, an amplification circuit employs a pair of amplification means in a push-pull arrangement for driving a load, the latter having the characteristic of drawing increased current at higher frequencies. First and second coupling means are employed to provide current to the pair of amplification means, normally at a relatively low value commensurate with lower frequency operation. However, frequency sensitive alternating current cross-coupling means are also included which are connected from each such amplification means to the current coupling means providing current to the remaining amplification means, in such phase relation that increased current is provided to the amplification means as required at higher frequencies. The cross-coupling means are effective as the frequency of the input signal increases to smoothly increase the current supplied in sufficient quantity to supply the capacitative displacement currents encountered at increased frequencies.

In accordance with a specific embodiment of the present invention, the amplification means comprise first and second operational amplifiers providing linear class A operation, and wherein the aforementioned means to supply current thereto also comprise amplifying elements. These amplifying elements are controlled by coupling means from the operational amplifiers to cause the active amplifying elements to provide additional current as higher frequency components are encountered in proportion to the frequency thereof.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements and in which the figure is a schematic diagram of an amplification circuit in accordance with the present invention.

The amplification circuit in accordance with the present invention is adapted for driving a load having increased current demands with increase in frequency, without distortion or lack of fidelity in reproduction of the signal being amplified, over a wide range of signal frequencies, amplitudes, etc. One such load comprises vertical deflection plates of a cathode ray tube as employed in a cathode ray oscilloscope. As the signal frequency increases, drive current must supply the additional displacement current necessary to charge the output capacitance of the load and stray capacitance and capacitance of the amplification circuit. As has been stated, in accordance with conventional design enough D.C. standing current must be run through an amplifier to provide for the highest bandwidth maximum signal voltage output that will ever occur. This D.C. current multiplied by the D.C. voltage drop across the load and amplification device is a D.C. power that is then dissipated as heat. Much of the time, however, the signal being amplified is of lower frequency and smaller amplitude and the high D.C. standing current is not really necessary. The present invention operates to automatically provide additional current only when necessary such that the amplification circuit normally operates at a lower power dissipation. The circuit according to the present invention examines the signal electronically, decides how much increase in current is necessary for a given signal and then automatically provides this current increase. Thus, the amplification circuit operates at high power only as large bandwidth signals are being amplified. Inasmuch as the amplification circuit operates normally at a lower power dissipation, higher bandwidth active amplifying devices may be employed which devices are not always available in higher power ratings.

Referring to the drawing, an input signal, for example, one to be displayed on a cathode ray oscilloscope, is indicated by sine wave $e_1$, while a 180° out of phase version thereof is indicated as $e_2$. The signal input is suitably provided from a push-pull amplifier (not shown) preceding the amplification circuit according to the present invention. The signal $e_1$ is applied to input terminal 10 of a first operational transistor amplifier including an NPN transistor 12 having its emitter 14 returned to ground. A feedback resistor 16 is connected between collector 18 and base 20 of transistor 12, while an input resistor 22 shunted by variable peaking capacitor 24 is interposed between base 20 and input terminal 10. Collector 18 is also coupled to lower vertical deflection plate 26 of a cathode ray tube indicated at 28. Capacitor 30 indicates circuit and load capacitance which may become troublesome as the frequency of the amplified signal increases, inasmuch as the amplified signal current must then charge this capacitance.

Input signal $e_2$ is similarly applied to input signal terminal 32 of a second operational amplifier employing an NPN transistor 34 having its emitter 36 grounded. A feedback resistor 38 is connected between collector 40 and base terminal 42 of the transistor while an input resistor 44 shunted by peaking capacitor 46 couples base 42 to input terminal 32. Collector 40 is also coupled to upper vertical deflection plate 48 of cathode ray tube 28. Capacitor 50 represents the load and circuit capacitance associated with plate 48 which must be charged at higher signal frequencies. Operational amplifiers are employed in driving both vertical deflection plates since they have good linearity characteristics in reproducing the input signal as well as driving the load therewith.

In accordance with the present invention, transistor 12 receives supply current from terminal 52 through load resistor 54, and a coupling means comprising PNP transistor 56 having its emitter 58 connected to resistor 54 and having its collector 60 connected to collector 18 of transistor 12. Similarly transistor 34 is supplied current from terminal 62 by way of load resistor 64, and a coupling means comprising PNP transistor 66 having its emitter 68 connected to resistor 64 and having its collector 70 connected to collector 40 of transistor 34. A base resistor 72 couples base 74 of transistor 56 to the midpoint of a voltage divider comprising resistor 78 and resistor 80 disposed between terminal 62 and ground. Also, a base resistor 82 is located between base 84 of transistor 66 and the midpoint of the same voltage divider. Frequency sensitive alternating current cross-coupling means comprising variable capacitors 86 and 88 are employed to control transistors 56 and 66. Capacitor 86 is disposed between collector 18 of transistor 12 and base 84 of transistor 66. Similarly, capacitor 88 is coupled between collector 40 of transistor 34 and base 74 of transistor 56.

The two transistorized operational amplifiers including transistors 12 and 34 respectively operate as class A amplifiers driving the respective vertical deflection plates 26 and 48. A zero signal current is provided which is large enough to provide a current swing needed through resistors 16 and 38, the collector resistance of the transistors, and with enough current left in transistors 12 and 34 to keep them from cutting off while maintaining a good operating point. This zero signal current is set by the bias voltages normally applied at bases 74 and 84 of transistors 56 and 66 from voltage dividers 78–80. For low frequency input and output signals, no additional current is required. The output signal $e_3$ of the first operational amplifier corresponds to the input signal $e_1$, and $i_1$ is the corresponding current passing through the emitter-collector path of transistor 56 toward collector 18 of transistor 12. Similarly, $e_4$ is the output of the second operational amplifier corresponding to input $e_2$. Current $i_2$ is the current supplied through the emitter-collector path of transistor 66 toward the collector 40 of transistor 34.

When a high frequency signal occurs, the negative swinging cathode ray tube plate, plate 26 for example, does so at a rate determined by conventional peaking, utilizing peaking capacitor 24. But the normal value of $i_2$ is such that it is normally insufficient for the corresponding positive swinging cathode ray tube deflection plate 48 since sufficient current is not available to charge load capacitor 50. However, as the frequency increases, $e_3$ is coupled via frequency sensitive capacitor 86 to base 84 of transistor 66. Since $e_3$ is negative going at this time, it causes an increase in the current flowing in the emitter-collector path of transistor 66, and therefore, additional current is supplied in sufficient quantity to just provide the charging current of capacitor 50. The increase in current is substantially proportional to the increase in frequency. Additional current provides the proper positive rate of swing of $e_4$ at this time such that signal distortion does not occur, with capacitor 86 being adjusted so as to provide the proper positive going transient response of $e_4$.

Similarly, when cathode ray tube deflection plate 48 is negative going and cathode ray tube plate 26 is positive going, the voltage $e_4$ is applied through capacitor 88 to the base 74 of transistor 56. This causes additional current to pass through the emitter-collector path of transistor 56 in sufficient quantity to provide the charging current for capacitor 30 and a proper positive rate of swing of $e_3$ occurs. Capacitor 88 is adjusted to provide the proper positive going transient response of $e_3$. Thus, in the push-pull arrangement, the phases are correct for the negative going operational amplifier, where the capacitive load is discharging, to provide drive for the current means supplying the operational amplifier where the load is being charged.

The average value of $i_1$ and $i_2$, and therefore power, is a function of signal rise time and frequency, as well as a function of the amplitude of higher frequency signals. Much of the time, power will be relatively low. The frequency sensitive alternating current cross-coupling is effective as the frequency of the input signal increases to smoothly increase the current supplied to the respective operational amplifier stages and to the loads they drive in sufficient quantity to avoid signal distortion and the like.

Although the frequency sensitive alternating current cross-coupling is illustrated as comprising capacitors, it is appreciated that other suitable frequency sensitive cross-coupling means may also be employed. For example, transformer coupling can be similarly utilized, inasmuch as such coupling can be arranged to become more effective as the frequency increases.

The amplification circuit in accordance with the present invention, thus provides decreased power dissipation at lower frequencies while operating at higher power only when and as a higher frequency or higher bandwidth signals, e.g. one having a fast rise time, is being amplified. In this manner, power drain from voltage supplies is reduced and less expensive components may be employed. Furthermore higher bandwidth active amplifying devices may be employed inasmuch as there is a trade-off in the design of such a device between high power and high bandwidth properties.

While I have shown and described a preferred embodiment of my invention, it will be apparent to those skilled in the art that many changes and modifications may be made without departing from my invention in its broader aspects. I, therefore, intend the appended claims to cover all such changes and modifications as fall within the true spirit and scope of my invention.

I claim:

1. An amplification circuit for providing increased current drive corresponding to greater bandwidth input signals, said amplification circuit comprising:

a first amplifier means for driving a load, said load having the characteristic of requiring increased current at higher ferquencies, and first coupling means for providing current to said first amplifier means, a second amplifier means for driving a load substantially 180° out of phase with said first amplifier means, and second coupling means for providing current to said second amplifier means, and frequency sensitive alternating current cross-coupling means disposed from said first amplifier means to said second coupling means and from said second amplifier means to said first coupling means effective in proper phase as the frequency of the input signal increases to smoothly increase the current supplied to said second amplifier means and said first amplifier means respectively in sufficient quantity to provide for said increased current of said load.

2. The amplification circuit according to claim 1, wherein said first coupling means for providing current to said second amplifier means and said second coupling means for providing current to said first amplifier means include active amplifying elements, each including a principal carrying path through which said current is provided, said frequency sensitive alternating current cross-coupling means operatively controlling said active amplifying elements to provide said increased current as the frequency increases.

3. The amplification circuit according to claim 2 wherein each of said cross-coupling means comprises a capacitor driven from a respective amplifier means and coupled to control the respective active amplifying elements in the proper phase relation for causing an increase in the current supplied by the first and second current supply means as the frequency of the input signal increases.

4. The amplification circuit according to claim 1 wherein said first and second amplifier means each comprise an operational amplifier.

5. An amplification circuit for driving the vertical deflection plates of a cathode ray tube and for providing displacement currents corresponding to higher frequency signals, said amplification circuit comprising:

a pair of operational transistor amplifiers coupled for driving the respective vertical deflection plates in push-pull relation, additional transistor amplifier means each having a principal collector-emitter current carrying path through which current is provided to a respective operational transistor amplifier, and capacitive cross-coupling means receiving the output of said operational transistor amplifiers and coupling each said output in driving relation to an additional transistor amplifier means supplying current to the remaining operational transistor amplifier of the pair for increasing the current supplied to the said operational transistor amplifiers and the circuit including said vertical deflection plates as the signal passing through said operational amplifiers increases in frequency, wherein the operational amplifier driving the negative going deflection plate representing a discharging load drives the additional amplifier supplying current to the operational amplifier coupled to the positive going plate and charging its load.

6. The amplification circuit according to claim 5 wherein each said transistor operational amplifier includes an input resistor and a feedback resistor, and a peaking capacitor shunted across each such input resistor.

7. The amplification circuit according to claim 5 wherein said capacitive cross-coupling means comprise variable capacitors.

8. An amplification circuit for providing increased current drive to a load on receipt of increased bandwidth signals comprising:

push-pull amplification means for driving a load, said load and its circuitry having the characteristic of drawing increased current at higher frequencies due to capacitive charging thereof and connecting circuitry, said push-pull amplification means driving opposite terminals of said load to provide current therefor, first means for providing additional current to said push-pull amplification means and for application to one of said terminals, second means for providing additional current to said push-pull amplification means and for application to a second of said terminals, and frequency sensitive alternating current coupling means between said push-pull amplification means and said first and second means for providing additional current effective as the frequency of the input signal increases to smoothly increase the current supplied to said push-pull amplification means and in phase relation for driving the first and second means to provide increased current at the corresponding load terminals as the waveform of voltage at such terminal increases.

References Cited

UNITED STATES PATENTS 3,217,266 11/1965 Pintell ------------ 330—27 X

RODNEY D. BENNETT, *Primary Examiner.*

B. L. RIBANDO, *Assistant Examiner.*

UNITED STATES PATENT OFFICE
CERTIFICATE OF CORRECTION

Patent No. 3,408,533 October 29, 1968

John M. P. Gates

It is certified that error appears in the above identified patent and that said Letters Patent are hereby corrected as shown below:

In the heading to the printed specification, line 3, "Tokyo, Japan, assignor to Tekronix," should read -- Portland, Oreg., assignor to Tektronix, --. Column 2, line 66, after "large" insert -- high --. Column 6, line 41, "terminals" should read -- terminal --.

Signed and sealed this 17th day of March 1970.

(SEAL)
Attest:

Edward M. Fletcher, Jr.
Attesting Officer

WILLIAM E. SCHUYLER, JR.
Commissioner of Patents